(12) United States Patent
Noh et al.

(10) Patent No.: US 10,075,197 B1
(45) Date of Patent: Sep. 11, 2018

(54) METHOD AND APPARATUS FOR TRANSMITTING HAMMING WEIGHT AND CODEWORD

(71) Applicant: LG ELECTRONICS INC., Seoul (KR)

(72) Inventors: Kwangseok Noh, Seoul (KR); Dongkyu Kim, Seoul (KR); Myeongjin Kim, Seoul (KR); Sangrim Lee, Seoul (KR); Hojae Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 10 days.

(21) Appl. No.: 15/452,687

(22) Filed: Mar. 7, 2017

(51) Int. Cl.
  *H03M 13/00* (2006.01)
  *H03M 13/09* (2006.01)
  *H04W 28/04* (2009.01)
  *H03M 13/29* (2006.01)

(52) U.S. Cl.
  CPC ........... *H03M 13/63* (2013.01); *H03M 13/09* (2013.01); *H03M 13/2957* (2013.01); *H04W 28/04* (2013.01)

(58) Field of Classification Search
  CPC ............. H03M 13/09; H03M 13/2906; H03M 13/2957; H03M 13/63; H03M 13/29
  See application file for complete search history.

(56) References Cited

U.S. PATENT DOCUMENTS

| | | | | |
|---|---|---|---|---|
| 2009/0259704 A1* | 10/2009 | Aharoni | ................... | G06F 7/58 708/210 |
| 2014/0173376 A1* | 6/2014 | Jeong | ................ | H03M 13/2906 714/755 |
| 2015/0194987 A1* | 7/2015 | Li | ......................... | H04L 1/0057 714/752 |
| 2017/0244429 A1* | 8/2017 | Hof | .................... | H03M 13/2924 |
| 2017/0264394 A1* | 9/2017 | Shen | ..................... | H04L 1/0071 |

* cited by examiner

*Primary Examiner* — Shelly A Chase
(74) *Attorney, Agent, or Firm* — Lee, Hong, Degerman, Kang & Waimey (57) ABSTRACT

A method for transmitting a codeword in a wireless communication system is disclosed. The method includes generating a codeword by encoding an input signal based on a polar code, acquiring a Hamming weight from a bit sequence of at least a part of the codeword, generating Hamming weight information based on the Hamming weight, and transmitting the Hamming weight information and the codeword to a receiver. The Hamming weight information includes a range indicator indicating a range to which the Hamming weight belongs, among a plurality of ranges.

12 Claims, 10 Drawing Sheets

METHOD AND APPARATUS FOR TRANSMITTING HAMMING WEIGHT AND CODEWORD

BACKGROUND OF THE INVENTION

Field of the Invention

The present disclosure relates to a method for transmitting a Hamming weight and a codeword in a wireless communication system, and more particularly, to a method for improving codeword decoding, using a Hamming weight.

Discussion of the Related Art

Wireless communication systems have been widely deployed in order to provide various types of communication services including voice and data services. In general, a wireless communication system is a multiple access system that can support communication with multiple users by sharing available system resources (a bandwidth, transmission power, etc.). Examples of multiple access systems include code division multiple access (CDMA), frequency division multiple access (FDMA), time division multiple access (TDMA), orthogonal frequency division multiple access (OFDMA), single carrier frequency division multiple access (SC-FDMA), multi carrier frequency division multiple access (MC-FDMA), etc.

Broadcast systems as well as the aforementioned communication systems have necessarily used a channel code. As a general method for configuring a channel code, a transmitting end can encode an input symbol using an encoder and transmitted the encoded symbol. In addition, for example, a receiving end can receive the encoded symbol and decode the received symbol to restore the input symbol. In this case, the size of the input symbol and the size of the encoded symbol can be defined in different ways according to a communication system. For example, in a turbo code for data information used in a long term evolution (LTE) communication system of a $3^{rd}$ generation partnership project (3GPP), the size of the input symbol is a maximum of 6144 bits and the size of the encoded symbol is 18432 (6144*3) bites. For turbo coding in an LTE communication system, refer to 3GPP TS 36.212.

However, the LTE turbo code has characteristics whereby enhancement in performance is slight when a signal to noise ratio (SNR) exceeds a predetermined range even if being increased due to a structure of the code. In this regard, a code with a low error rate as possible can be considered, but in this case, complexity is increased.

A high error rate in a communication system can cause retransmission of unnecessary data and failure in channel reception. In addition, a code with excessively high complexity can cause delay in transmission and reception as well as can increase loads of a base station and a user equipment (UE). In particular, a next-generation communication system that requires rapid transmission and reception of data as possible requires the aforementioned problems. Accordingly, there is a need for a coding method with a low error rate and low complexity.

In particular, the current LTE Turbo codes have a problem of an error floor which happens as the size of the information gets increased. Accordingly, a channel coding method capable of satisfying ultra reliable radio (URR) and low latency radio (LLR) is required.

SUMMARY OF THE INVENTION

Accordingly, an aspect of the present disclosure is to provide an improved method for decoding a polar code based on a Hamming weight.

Another aspect of the present disclosure is to provide a method for reducing signaling overhead by use of Hamming weight information.

Another aspect of the present disclosure is to provide an apparatus supporting the above methods.

It will be appreciated by persons skilled in the art that the objects that could be achieved with the present disclosure are not limited to what has been particularly described hereinabove and the above and other objects that the present disclosure could achieve will be more clearly understood from the following detailed description.

In an aspect of the present disclosure, a method for transmitting a codeword by a transmitter in a wireless communication system includes generating a codeword by encoding an input signal based on a polar code, acquiring a Hamming weight from a bit sequence of at least a part of the codeword, generating Hamming weight information based on the Hamming weight, and transmitting the Hamming weight information and the codeword to a receive. The Hamming weight information includes a range indicator indicating a range to which the Hamming weight belongs, among a plurality of ranges.

Each of the plurality of ranges may be divided into at least two sub-ranges, and the Hamming weight information may further include a sub-range indicator indicating a sub-range to which the Hamming weight belongs in the range to which the Hamming weight belongs.

The Hamming weight information may further include a 1-bit indicator indicating whether the Hamming weight is an odd number or an even number.

The bit sequence of the at least part of the codeword may include a cyclic redundancy check (CRC) of the codeword.

The bit sequence of the at least part of the codeword may include a most significant bit (MSB) of the codeword.

The Hamming weight information may be used to decode the codeword by list decoding.

In another aspect of the present disclosure, a terminal for transmitting a codeword in a wireless communication system includes a transceiver for transmitting and receiving a signal, and a processor for controlling the transceiver. The processor is configured to generate a codeword by encoding an input signal based on a polar code, to acquire a Hamming weight from a bit sequence of at least a part of the codeword, to generate Hamming weight information based on the Hamming weight, and to transmit the Hamming weight information and the codeword to a receiver. The Hamming weight information includes a range indicator indicating a range to which the Hamming weight belongs, among a plurality of ranges.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The following technology may be used for various wireless access systems such as code division multiple access (CDMA), frequency division multiple access (FDMA), time division multiple access (TDMA), orthogonal frequency division multiple access (OFDMA), and single carrier frequency division multiple access (SC-FDMA). The CDMA may be implemented by radio technology such as universal terrestrial radio access (UTRA) or CDMA2000. The TDMA may be implemented by radio technology such as global system for mobile communications (GSM)/general packet radio service (GPRS)/enhanced data rates for GSM evolution (EDGE). The OFDMA may be implemented by radio technology such as IEEE 802.11 (Wi-Fi), IEEE 802.16 (WiMAX), IEEE 802.20, and evolved UTRA (E-UTRA). The UTRA is a part of the universal mobile telecommunications system (UMTS). A 3rd generation partnership project long term evolution (3GPP LTE) communication system is a part of an evolved UMTS (E-UMTS) that uses E-UTRA, and employs OFDMA on downlink while employing SC-FDMA on uplink. LTE-advanced (LTE-A) is an evolved version of the 3GPP LTE system.

For the sake of clarity, 3GPP LTE/LTE-A is mainly described, but the technical idea of the present invention is not limited thereto. Specific terms used for the embodiments of the present invention are provided to help the understanding of the present invention. These specific terms may be replaced with other terms within the scope and spirit of the present invention.

Figure 1:
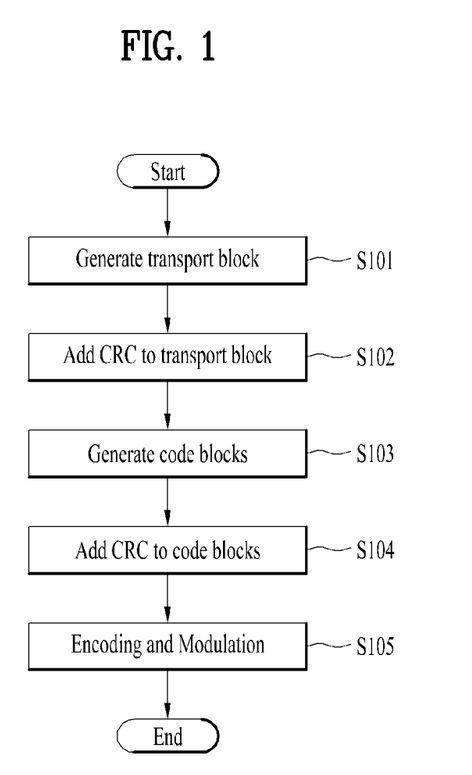
FIG. 1 illustrates a coding procedure according to an example.

FIG. 1 illustrates a coding procedure according to an example.

The coding procedure as shown in FIG. 1 may be applied to many channel codes including a turbo code used in the LTE communication system. Hereinafter, for simplicity, the coding procedure will be described based on terminology according to LTE communication system standards.

In the example of FIG. 1, the transmitting end may generate a transport block (TB) (S101). In addition, the transmitting end adds a CRC bit for the transport block to the transport block (S102). In addition, the transmitting end may generate code blocks from the transport block to which the CRC bit is added (S103). For example, the transmitting end may segment the transport block into code blocks based on the input size of the encoder. Further, the transmitting end may add a CRC bit for each divided code block (S104). In this case, for example, the code block and the code block CRC bits may be configured with a size of 6144 bits. The transmitting end may perform encoding and modulation (S105) on each block including code blocks and CRC bits. For example, turbo coding may be applied as described above.

The decoding procedure may be performed in the reverse order of the coding procedure of FIG. 1. For example, the receiving end may decode each code block using a decoder corresponding to each encoder, finally construct one transport block, and then check whether the transport block has passed the CRC.

For example, the size of the input symbols may be different from that of the transport block (TB) from the Media Access Control (MAC) layer. If the size of the transport block is larger than the maximum input symbol size of the turbo code, the transport block may be segmented into a plurality of code blocks (CB). According to the LTE communication system standard, the size of the code blocks may be equal to a result obtained by subtracting the CRC (Cyclic Redundancy Check) bits from 6144 bits. An input symbol of a turbo code may be defined as data including code blocks and CRC or data including a transport block (wherein the size of the transport block is less than, for example, 6144 bits) and CRC. The size of the CRC bits is very small (e.g., a maximum of 24 bits) compared to 6144 bits. Accordingly, in the following description, unless otherwise defined, a code block may refer to the code block itself or a CRC bit corresponding to the code block, and a transport block refers to the transport block itself or CRC bits corresponding to the transport block.

Figure 2:
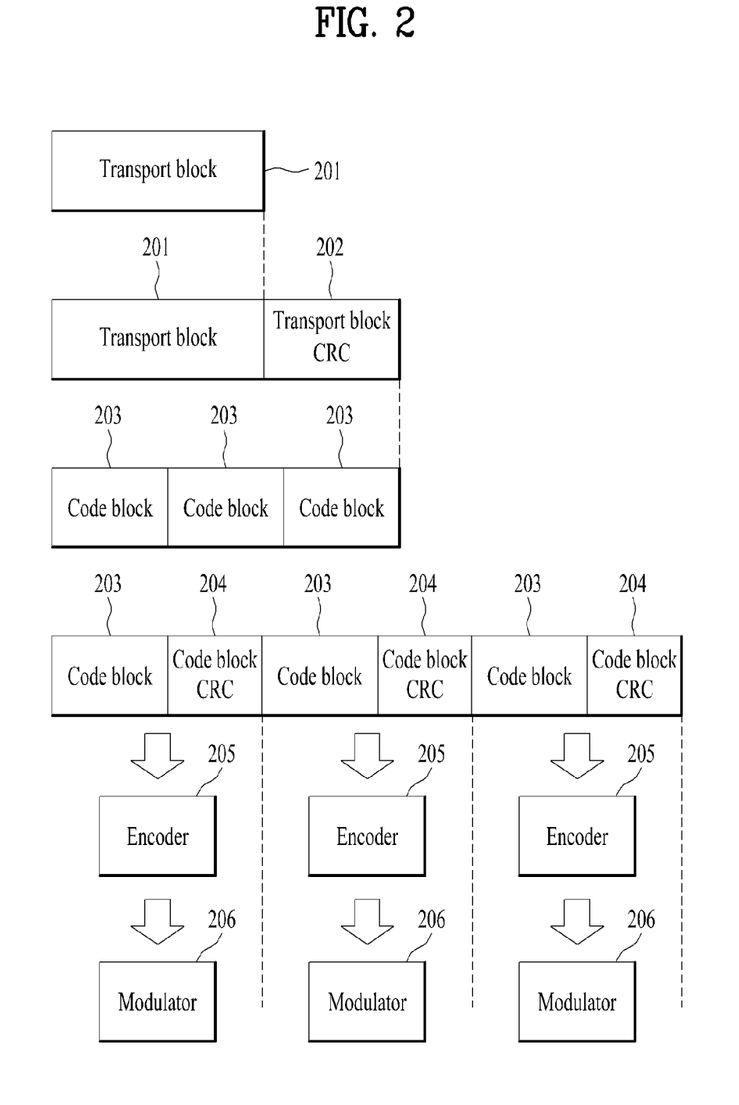
FIG. 2 illustrates a procedure of encoding a transport block according to an example.

FIG. 2 illustrates a procedure of encoding a transport block according to an example.

FIG. 2 illustrates a procedure of encoding a transport block 201 corresponding to the coding procedure described above with reference to FIG. 1. First, transport block CRC 202 is added to the transport block 201. The transport block CRC 202 may be used for identification of the transport block 201 in the decoding procedure. The transport block 201 and the transport block CRC 202 are then segmented into three code blocks 203. While the transport block 201 is segmented into three code blocks 203 in this embodiment, the transport block 201 may be segmented into a plurality of code blocks based on the input size of the encoder 205.

Code block CRC 204 is added to each of the code blocks 203. The code block CRC 204 may be used for identification of the code block 203 at the receiving end. The code blocks 203 and the code block CRC 204 may be coded via the encoder 205 and the modulator 206.

Figure 3:
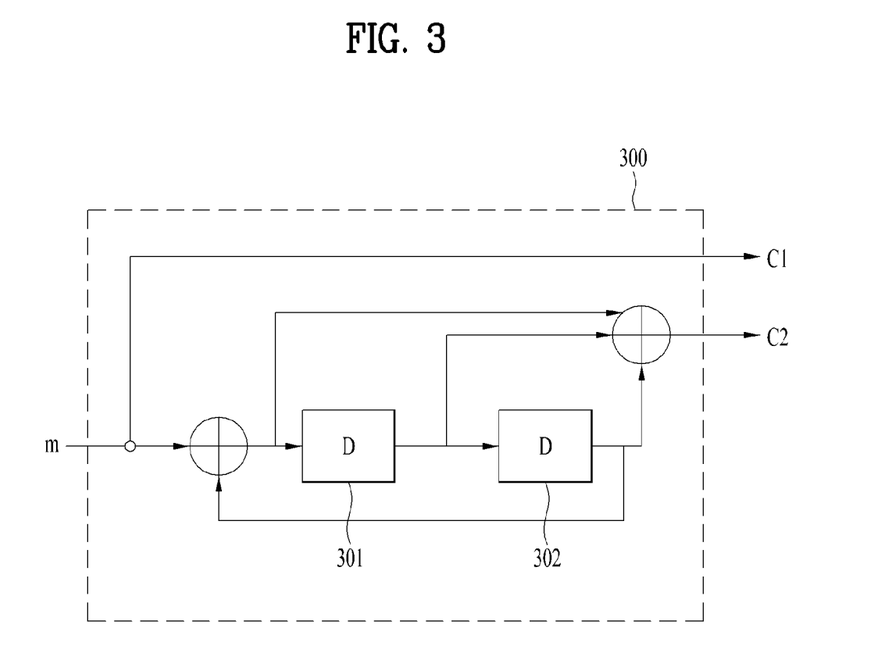
FIG. 3 illustrates a recursive systematic convolutional (RSC) encoder according to an example.

FIG. 3 illustrates a recursive systematic convolutional (RSC) encoder according to an example.

An RSC encoder 300 of FIG. 3 may be used for turbo coding. In FIG. 3, m denotes input data, C1 denotes a systematic bit string, and C2 denotes a coded bit string. Here, the RSC encoder 300 has a code rate of 1/2.

The RSC encoder 300 may be configured by feeding back a coded output to the input of a non-recursive non-systematic convolutional encoder. In the embodiment of FIG. 3, the encoder 300 includes two delay units 301, 302. The value D of the delay units 301 and 302 may be determined according to a coding scheme. The delay unit 301, 302 may include a memory or a shift register.

Figure 4:
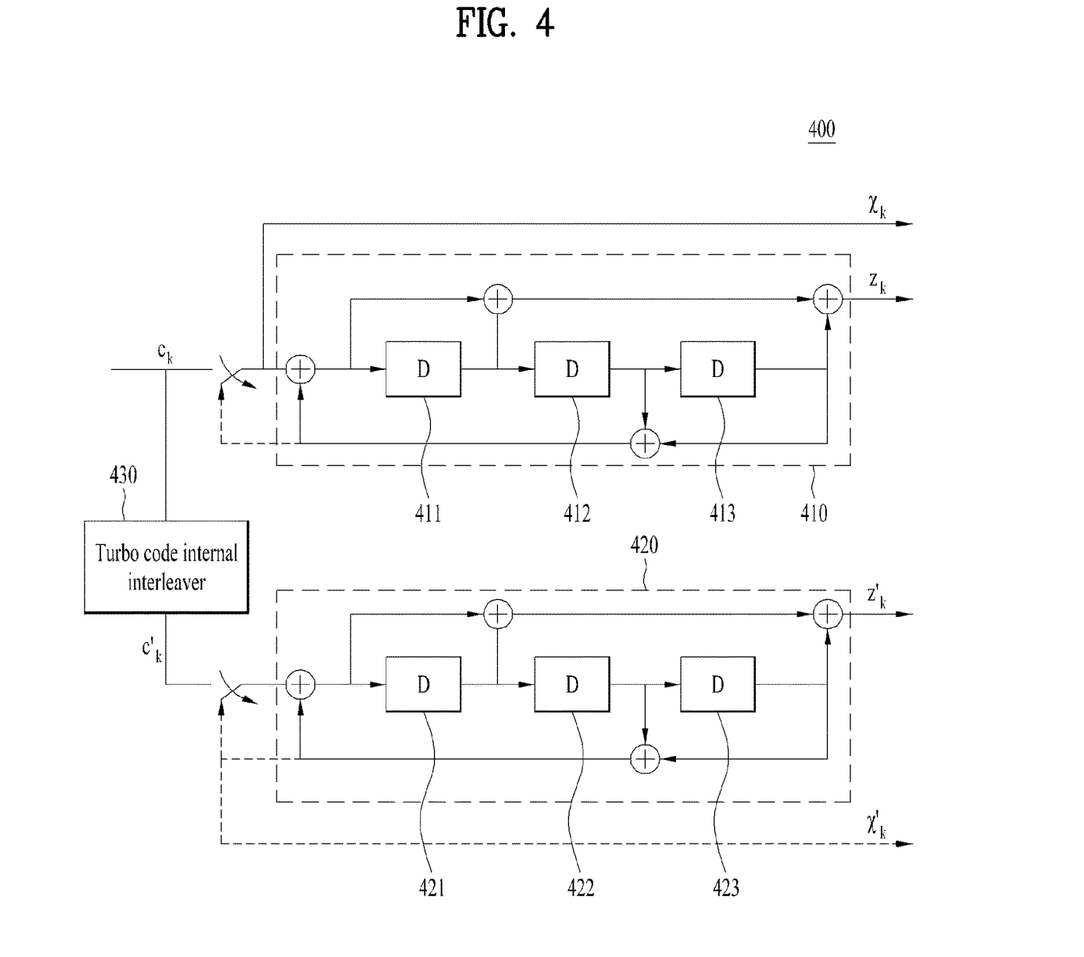
FIG. 4 illustrates a long term evolution (LTE) turbo encoder.

FIG. 4 illustrates an LTE turbo encoder.

The coding scheme of the LTE turbo encoder 400 is a parallel concatenated convolutional code (PCCC) having two 8-state constituent encoders 410 and 420 and a turbo code internal interleaver 430.

In FIG. 4, the turbo encoder 400 includes a first constituent encoder 410, a second element encoder 420, and a turbo code internal interleaver 430. The first constituent encoder 410 and the second constituent encoder 420 are 8-state constituent encoders. The first constituent encoder 410 and the second constituent encoder 420 are configured in a structure similar to that of the RSC encoder of FIG. 3. Each of the first constituent encoder 410 and the second constituent encoder 420 includes three delay units 411, 412 and 413, 421, 422 and 423.

In FIG. 4, D is a value determined according to a coding scheme and $c_k$ is an input to the turbo encoder 400. The outputs from the first constituent encoder 410 and the second constituent encoder 420 are denoted by $z_k$ and $z'_k$, respectively. The value output from the turbo code internal interleaver 430 is denoted by $c'_k$. Generally, the delay units 411, 412, 413, 421, 422, 423 may delay the input values by one clock. However, the delay units 411, 412, 413, 421, 422, 423 may be configured to delay the input values by more than one clock depending on the internal configuration thereof. The delay unit 411, 412, 413, 421, 422, 423 may include a shift register, delay an input bit by a predetermined clock, and then output the input bit to the next delay unit 411, 412, 413, 421, 422, 423.

The turbo code internal interleaver 430 may lower the influence of a burst error that may occur when a signal is transmitted over a radio channel. For example, the turbo code internal interleaver 430 may be a quadratic polynomial permutation (QPP) interleaver.

The turbo code is a high performance forward error correction (FEC) code and is used in the LTE communication system. For example, a data block coded by the turbo code may include three sub-blocks. One of the sub-blocks may correspond to m-bit payload data. Another subblock may be configured with n/2 bits, i.e., parity bits for the payload, calculated using a recursive systematic convolution (RSC) code. The other subblock may be configured with n/2 bits, i.e., parity bits for permutation of payload data, calculated using an RSC code. For example, the above-described permutation may be performed by an interleaver. Thus, two sub-blocks having different parity bits and the payload may constitute one block. For example, if m is equal to n/2, one block has a code rate of 1/3.

In the first constituent encoder 410, the procedure in which the input $c_k$ reaches the coded bit $z_k$ may be divided into two paths. The two paths are a first path connected from an input terminal to an output terminal without output feedback and a second path fed back from an input terminal to the input terminal.

In the first path, an input $c_k$ passed through the delay unit 411, and an input $c_k$ passed through the delay units 411, 412, and 413 are applied to the output terminal. The relationship between the input terminal and the output terminal for the first path may be expressed by a polynomial. The polynomial for the first path is called a forward generator polynomial and may be expressed as g1 in the following equation.

$$g1(D)=1+D+D^3 \quad \text{[Equation 1]}$$

In the second path, an input $c_k$, an input $c_k$ passed through the delay units 411 and 412, and an input $c_k$ passed through the delay units 411, 412 and 413 are fed back to the input terminal. The polynomial for the second path is called a recursive generator polynomial and may be expressed as g0 in the following equation.

$$g0(D)=1+D^2+D^3 \quad \text{[Equation 2]}$$

In [Equation 1] and [Equation 2], "+" means exclusive OR (XOR), and 1 means that the input undergoes 0 delay. In addition, $D^n$ means that the input undergoes n delays.

Figure 5:
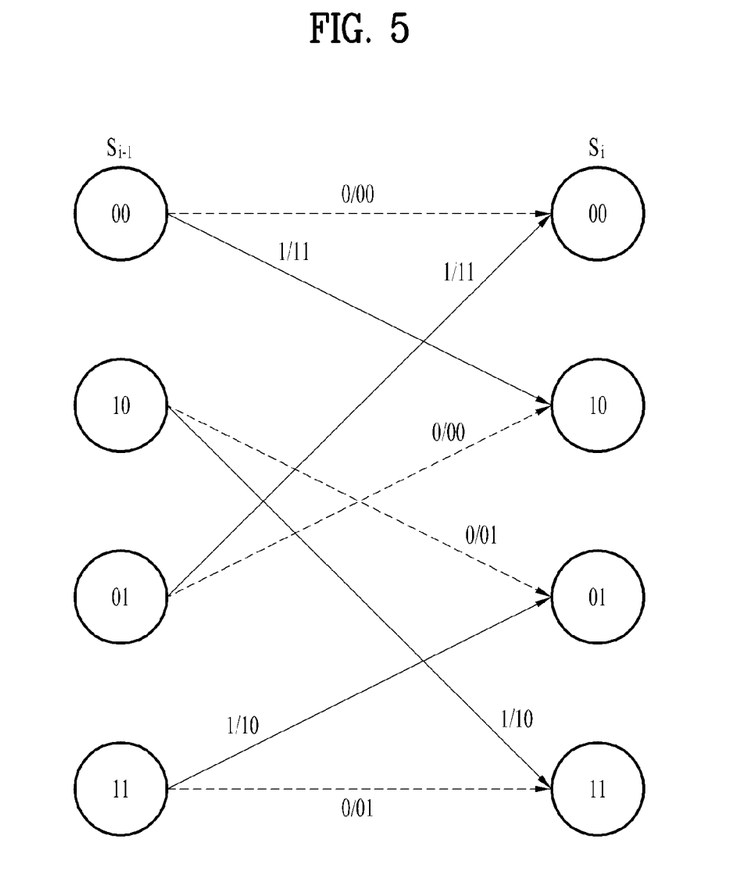
FIG. 5 illustrates an example of a trellis according to an RSC encoder.

FIG. 5 illustrates an example of a trellis according to an RSC encoder.

FIG. 5 shows the structure of the trellis of the RSC encoder shown in FIG. 3. In FIG. 5, $S_i$ denotes the state of the $i^{th}$ input data. In FIG. 5, each circle represents a corresponding node. In addition, a line connected between nodes represents a branch. The solid line represents a branch for the input value of 1, and the dotted line represents a branch for the input value of 0. The value on a branch is indicated by m/C1C2 (input value/systematic bit, coded bit). The trellis may also have a state that is exponentially proportional to the number of memories of the encoder. For example, if the number of memories included in the encoder is a, $2^a$ states may be included in the trellis.

The trellis is a state machine that shows a possible state transition of an encoder between two states. A convolutional encoder such as the RSC encoder may perform coding according to a trellis diagram. The codeword coded by the RSC encoder may be decoded according to an algorithm based on the trellis structure. For example, the Viterbi or BCJR (Bahl, Cocke, Jelinek and Raviv) algorithm may be used.

Figure 6:
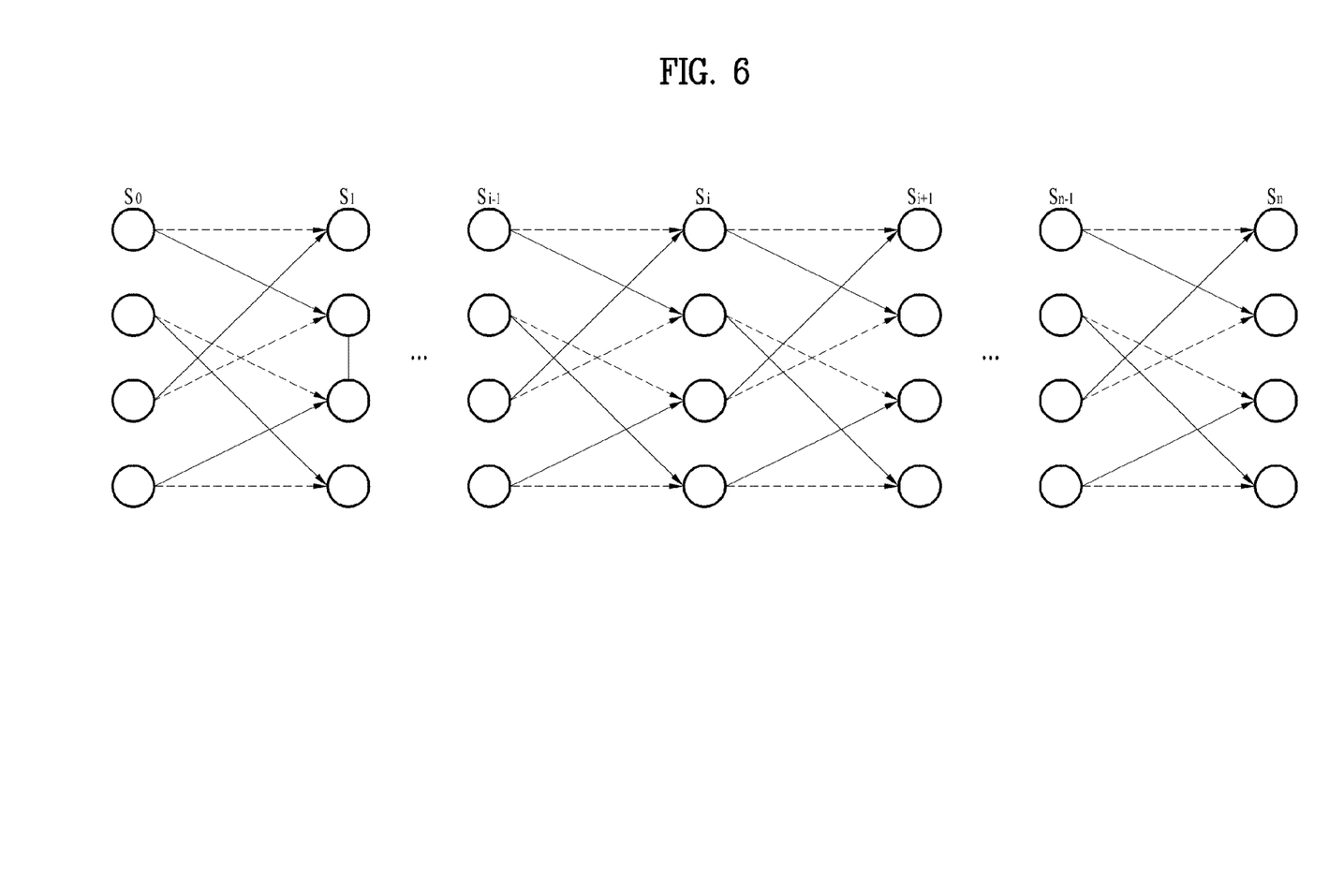
FIG. 6 illustrates an example of a trellis structure.

FIG. 6 illustrates an example of a trellis structure.

In FIG. 6, n denotes the length of a codeword. Typically, the trellis may be terminated by adding an additional bit after an input sequence. In general, a sequence configured as a sequence of 0 is referred to as a tail bit. The tail bit causes the nodes in one state of the trellis to have 0 as a value to terminate the trellis.

In FIG. 6, the length of the codeword may be determined in consideration of the length k of the input data and the length t of the tail bits. For example, if the code rate is R, the length n of the codeword may be (k+t)/R. In general, a length by which all delay units (e.g., memories) of the encoder may be reset may be determined as the length t of the tail bits. For example, the RSC encoder of FIG. 3 may use a total of 2 bits as the tail bits. The turbo encoder for LTE communication as shown in FIG. 4 may use 3 bits as the tail bits.

The length of the tail bits is shorter than the length of the input data. As described above, since the length of the codeword is associated with the length of the tail bits, loss of the code rate may occur due to the tail bits when the length of the codeword is limited. However, despite the loss of the code rate due to the tail bits, the trellis is terminated using the tail bits in many cases. This is because this method lowers computational complexity and exhibits excellent error correction performance.

The puncturing code refers to a method of puncturing a part of a codeword. In the puncturing code, a part of a codeword is punctured such that the part of the codeword is not transmitted. For example, the puncturing code may be used to lower the code rate loss caused by addition of tail bits. In this case, the receiving end may perform decoding using the trellis corresponding to the sum of the length k of the input data and the length t of the tail bits. That is, the receiving end may perform decoding on the assumption that the non-punctured codeword is received. In this case, the receiving end may consider that there is no input value for the branch from a node corresponding to the punctured bit (i.e., the bit not transmitted from the transmitting end). That is, for the branches of the node, the input data is assumed to be 0 or 1 with the same probability.

Compared to an LTE turbo code using tail bits, a double binary turbo code has a tail biting structure. The tail biting structure is a scheme of ending a trellis by rendering the initial and last states of an encoder to be the same. That is, as the initial and last states of the encoder form the same circulation state, the trellis ends, and no tail bits are needed. However, the double binary LTE turbo code requires pre-encoding to determine a circulation state. Therefore, a coding speed may be decreased due to addition of a coding operation. In general, pre-encoding may be performed in two steps. First, encoding is performed by setting an initial state to '0'. Then, the initial and last states are set to be the same according to a predetermined relationship based on the encoded last state.

The turbo code may offer an error correction performance close to Shannon's theoretical limit, while having a relatively simple structure. However, if a specific SNR is exceeded, decoding performance is further improved very slightly. In other words, the turbo code has an error floor in which error rate improvement is negligibly small at or above a specific SNR.

In this regard, the polar code is presented as an alternative to the turbo code. The polar code is known as a code that may achieve a channel capacity for a binary-input discrete memoryless channel (B-DMC) in theory. Therefore, if it is assumed that the length of a code block of the polar code is infinite, the channel capacity for B-DMC may be achieved. The polar code is a kind of linear block code and has relatively low decoding complexity.

Figure 7:
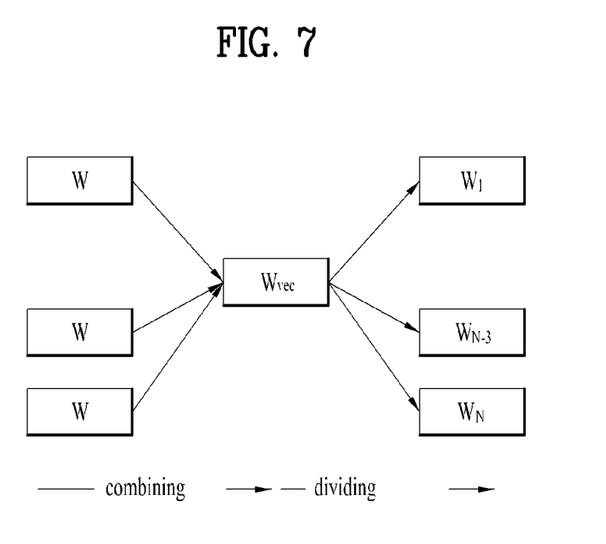
FIG. 7 is an exemplary view illustrating the concept of polar encoding.

FIG. 7 is an exemplary view illustrating the concept of polar encoding.

The polar encoding may involve channel combining and channel splitting. As illustrated in FIG. 7, the original channels shown on the left side are appropriately combined into a vector channel. The vector channel is split into new polarized channels, as illustrated on the right side of FIG. 7. In theory, the channel capacity of a channel of an infinite length may be divided into channel capacities C(W)=0 and C(W)=1.

Figure 8:
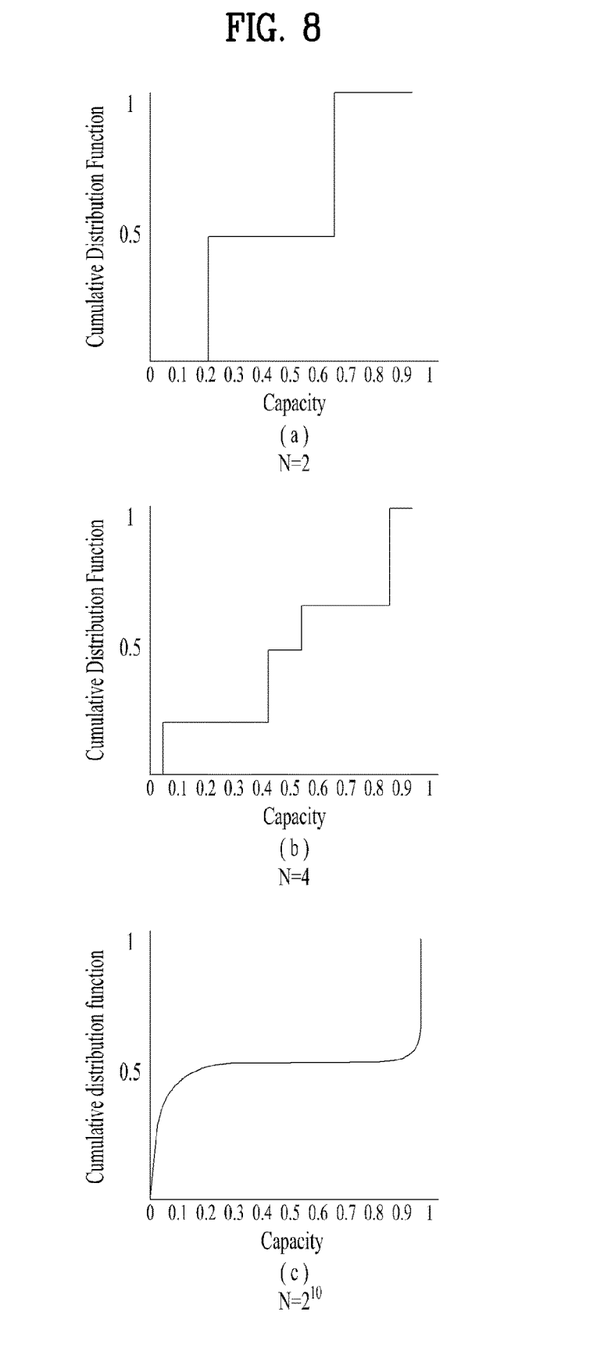
FIG. 8 illustrates polarization according to the length of a code block.

FIG. 8 illustrates polarization according to the length of a code block.

As illustrated in (a), (b), and (c) of FIG. 8, as the length of a code block, N increases, the channel capacity is polarized to 1 or 0.

Figure 9:
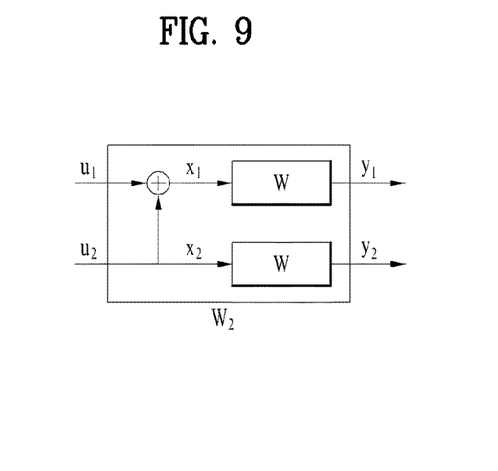
FIG. 9 illustrates a base module for a polar code.

FIG. 9 illustrates a base module for a polar code.

The channel combining described above with reference to FIG. 7 may be performed by concatenating B-DMCs in parallel. After the channel combining, the length of a code block may be determined. In FIG. 9, W represents a B-DMC. The base module of FIG. 9 combines two B-DMCs. In FIG. 9, $y_1$ and $y_2$ represent binary-input source bits, $x_1$ and $x_2$ represent inputs to channels W, and $y_1$ and $y_2$ represent output coded bits. A channel equivalent to the total channels is denoted by $W_2$ in FIG. 9. A base matrix F for the base module of FIG. 9 is expressed as the following [Equation 3].

$$F = \begin{bmatrix} 1 & 0 \\ 1 & 1 \end{bmatrix}$$ [Equation 3]

While two channels are combined in FIG. 9, N B-DMCs may be combined. Hereinbelow, N is $2^n$ where n is an integer equal to or greater than 0. If N channels are combined, each of the channels may be represented as a recursive form. For a generator matrix $G_N$, an output $x_1^N$ for input bits $u_1^N$ may be expressed as the following [Equation 4].

$$x_1^N = u_1^N G_N$$ [Equation 4]

where $x_1^N = \{x_1, \ldots, x_N\}$ and $u_1^N = \{u_1, \ldots, u_N\}$. The generator matrix $G_N$ may be expressed as [Equation 5] using the base matrix F described in [Equation 3].

$$G_N = B_N F^{\otimes n}$$ [Equation 5]

where $F^{\otimes n} = F \otimes F^{\otimes(n-1)}$, and $F^{\otimes 0} = 1$. A permutation matrix $B_N$ is represented as [Equation 6].

$$B_N = R_N \begin{bmatrix} B_{N/2} & 0 \\ 0 & B_{N/2} \end{bmatrix} = R_N \left( I_2 \otimes B_{\frac{N}{2}} \right)$$ [Equation 6]

where $R_N$ represents a bit-reversal interleaver. For an input $(s_1, s_2, \ldots, s_N)$, $R_N$ is defined as [Equation 7].

$$(s_1, s_2, \ldots, s_N) R_N = (s_1, s_3, \ldots, s_{N-1}, s_2, s_4, \ldots, s_N)$$ [Equation 7]

Figure 10:
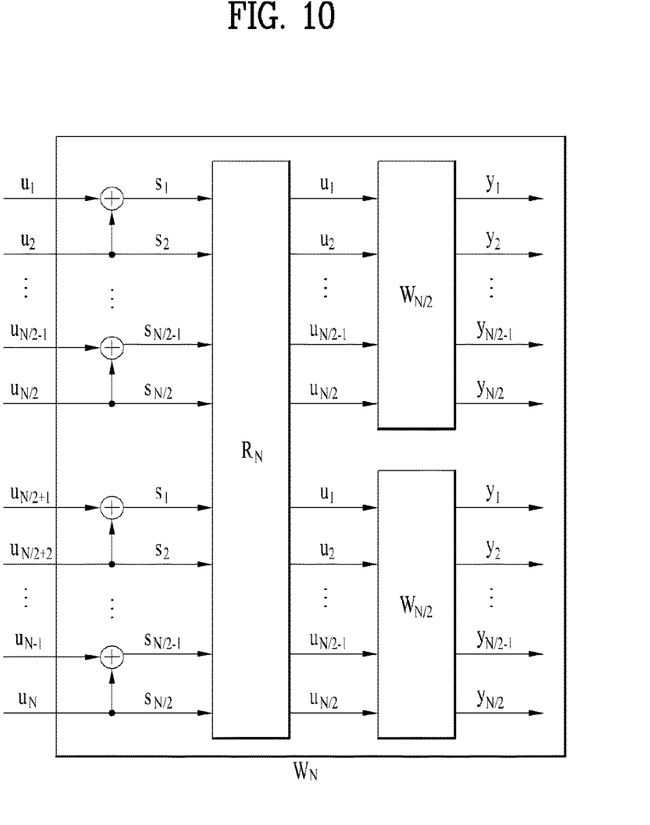
FIG. 10 illustrates exemplary N-level channel combining.

FIG. 10 illustrates exemplary N-channel channel combining.

The N-channel channel combining illustrated in FIG. 10 may be expressed as [Equation 8].

$$u_1^N W_N = y_1^N$$ [Equation 8]

[Equation 8] may be represented as [Equation 9], referring to [Equation 3] to [Equation 7].

$$u_1^N \left( I_{\frac{N}{2}} \otimes W_2 \right) R_N (I_2 \otimes W_{N/2}) = y_1^N$$ [Equation 9]

A process of defining a channel equivalent to a specific input after N B-DMCs are combined may be referred to as channel splitting. An equivalent channel $W_N^{(i)}$ of an $i^{th}$ channel among the N channels may be represented with a channel transition probability as described in [Equation 10].

$$W_N^{(i)}(y_1^N, u_1^{i-1} | u_i) = \sum_{u_{i+1}^N} \frac{1}{2^{N-1}} W_N(y_1^N | u_1^N)$$ [Equation 10]

If the above-described channel combining and channel splitting are performed, the following theorem may be obtained. For any B-DMC W, the channel $W_N^{(i)}$ is polarized in the following sense. As N gets infinite among indexes $i \in \{1, \ldots, N\}$, some indexes satisfying $I(W_N^{(i)}) \in (1-\delta, 1]$ become I(W), and other indexes satisfying $I(W_N^{(i)}) \in [0, \delta)$ become 1-I(W) (1 (here, $\delta \in (0,1)$). Therefore, as N gets infinite, the channel is polarized and thus becomes a perfect noise channel or noise-free channel. Accordingly, a transmitter may transmit data on the noise-free channel.

As described above, if the length of a code block, N becomes infinite, an equivalent channel for a specific input bit may be classified as a noise channel or a noise-free channel. This implies that the capacity of the equivalent channel for the specific input bit is 0 or the capacity of the channel W, I(W).

The above polar code may be decoded by successive cancellation (SC) decoding. The SC decoding may be performed by calculating a channel transition probability and then calculating the likelihood ratio (LLR) of an input bit based on the calculated channel transition probability. In this case, the channel transition probability may be calculated recursively based on the idea that channel combining and channel splitting are recursive. As a consequence, the LLR may also be calculated recursively.

The channel transition probability $W_N^{(i)}(y_1^N, u_1^{i-1}|u_i)$ may be expressed as [Equation 11]. In [Equation 11], an input bit a is represented by an odd-numbered index $u_{1,o}^i$ or an even-numbered index $u_{1,e}^i$.

[Equation 11]

$$W_{2N}^{(2i-1)}(y_1^{2N}, u_1^{2i-2} | u_{2i-1}) = \sum_{u_{2i}^{2N}} \frac{1}{2^{2n-1}} W_{2N}(y_1^{2N} | u_1^{2N})$$

$$= \sum_{u_{2i,o}^{2N}, u_{2i,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N})$$

$$= \sum_{u_{2i}} \frac{1}{2} \sum_{u_{2i+1,e}^{2N}} \frac{1}{2^{N-1}} W_N(y_{N+1}^{2N} | u_{1,e}^{2N}) \sum_{u_{2i+1,o}^{2N}} \frac{1}{2^{N-1}} W_N(y_1^N | u_{1,o}^{2N} \oplus u_{1,e}^{2N})$$

$$= \sum_{u_{2i}} \frac{1}{2} W_N(y_1^N | u_{1,o}^{2i-2} \oplus u_{1,e}^{2i-2} | u_{2i-1} \oplus u_{2i}) W_N^{(i)}(y_{N+1}^{2N}, u_{1,e}^{2i-2} | u_{2i})$$

Further, [Equation 10] may be developed to [Equation 12].

[Equation 12]

$$W_N^{(i)}(y_1^N, u_1^{i-1} | u_i) = \sum_{u_{i+1}^N} \frac{1}{2^{N-1}} W_N(y_1^N | u_1^N)$$

$$= \sum_{u_{2i+1,o}^{2N}, u_{2i+1,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N})$$

$$= \frac{1}{2} \sum_{u_{2i+1,e}^{2N}} \frac{1}{2^{N-1}} W_N(y_{N+1}^{2N} | u_{1,e}^{2N}) \sum_{u_{2i+1,o}^{2N}} \frac{1}{2^{N-1}} W_N(y_1^N | u_{1,o}^{2N} \oplus u_{1,e}^{2N})$$

$$= \frac{1}{2} W_N^{(i)}(y_1^N | u_{1,o}^{2i-2} \oplus u_{1,e}^{2i-2} | u_{2i-1} \oplus u_{2i}) W_N^{(i)}(y_{N+1}^{2N}, u_{1,e}^{2i-2} | u_{2i})$$

Therefore, the LLR $$L_N^{(i)} = \frac{W_N^{(i)}(y_1^N, \hat{u}_1^{i-1} | 0)}{W_N^{(i)}(y_i^N, \hat{u}_1^{i-1} | 1)}$$

may be calculated by [Equation 13] and [Equation 14].

$$L_N^{(2i-1)}(y_1^N, \hat{u}_1^{2i-1}) =$$ [Equation 13]

$$\frac{L_{\frac{N}{2}}^{(i)}\left(y_1^{\frac{N}{2}}, \hat{u}_{1,o}^{2i-2} \oplus \hat{u}_{1,e}^{2i-2}\right) L_{\frac{N}{2}}^{(i)}\left(y_{\frac{N}{2}+1}^N, \hat{u}_{1,e}^{2i-2}\right) + 1}{L_{\frac{N}{2}}^{(i)}\left(y_1^{\frac{N}{2}}, \hat{u}_{1,o}^{2i-2} \oplus \hat{u}_{1,e}^{2i-2}\right) L_{\frac{N}{2}}^{(i)}\left(y_{\frac{N}{2}+1}^N, \hat{u}_{1,e}^{2i-2}\right)}$$

$$L_N^{(2i)}(y_1^N, \hat{u}_1^{2i-1}) =$$ [Equation 14]

$$\left[L_{\frac{N}{2}}^{(i)}\left(y_1^{\frac{N}{2}}, \hat{u}_{1,o}^{2i-2} \oplus \hat{u}_{1,e}^{2i-2}\right)\right]^{1-2\hat{u}_{2i-1}} L_{\frac{N}{2}}^{(i)}\left(y_{\frac{N}{2}+1}^N, \hat{u}_{1,e}^{2i-2}\right)$$

The complexity of a polar encoder and an SC decoder varies with the length of a code block, N. The complexity is known to be O(N log N).

For a polar code with a code block length of N, given a K-bit input, the coding rate is N/K. In this case, if a generator matrix for a polar encoder with a data payload length of N is $G_N$, encoded bits may be given by $x_1^N = u_1^N G_N$. Among the input bits $u_1^N = \{u_1, \ldots u_N\}$, K bits are payload bits. It is assumed that a row index corresponding to a payload bit in the generator matrix $G_N$ is I. Then, the minimum distance $d_{min}(C)$ of the polar code may be represented as [Equation 15].

$$d_{min}(C) = \min_{i \in I} 2^{wt(i)}$$ [Equation 15]

where wt(i) is a number within a binary expansion of i(i=0, 1, . . . , N−1).

Along with various encoding methods, various decoding methods have been proposed. For example, list decoding is one of decoding methods of error correction codes. In list decoding, a list of probabilities of being correct is output, instead of a single possible message. List decoding is suitable for dealing with a large number of errors.

A unique decoding model outputs a single valid codeword from a received word. However, it is difficult to decode a codeword at a high error rate in the unique decoding model. This may cause a gap between the error correction performance of a stochastic noise model and the error correction performance of an adversarial noise model. Owing to the development of the coding theory since the mid of 1990s, such a gap has been studied. For example, the gap may be eliminated based on a relaxed error-correction model that may be called list decoding. In list decoding, lists of codewords for general error patterns in the worst case are output. The output lists include actually transmitted codewords. Regarding the general error patterns, the decoder may output a unique single codeword.

List decoding may also be applied to the polar code. For example, list decoding of a polar code based on an SC list decoder has been proposed (e.g., I. Tal and A. Vardy, "List decoding of polar codes," in Proc. IEEE Int. Symp. Inf. Theory, pp. 1-5, July 2011.). A list-X decoding algorithm may track X paths simultaneously, for decoding a polar code. Further, the list-X decoding algorithm may detect an error-free path by checking a cyclic redundancy check (CRC) for each path. Despite high complexity relative to an SC algorithm, list-X decoding has improved decoding performance.

If a list decoding algorithm is used, a part of a CRC is used to detect an error-free path. However, the list decoding algorithm faces a high probability of false alarm. Although a CRC may be added to decrease the false alarm probability, the additional CRC may increase overhead.

Now, a description will be given of a method for replacing a CRC or reducing the number of CRC bits in list decoding of a polar code. In the following embodiments, a method for reducing signaling overhead and a false alarm probability using a Hamming weight will also be described.

A Hamming weight is the number of non-zero symbols in a string. The Hamming weight is identical to the Hamming distance of a string of the same length with all symbols being zeroes. Typically, a string is a bit string. In this case, the number of bits having ones in a string is a Hamming weight. Hamming weight may be interchangeable with the terms, population count, popcount, or sideway sum. For example, the Hamming weight of a string [1, 0, 0, 1, 1, 0] is 3.

In the following embodiments, a Hamming weight is calculated for an m-bit sequence out of a K information bit sequence. K is a natural number equal to or greater than 1, and m is a natural number equal to or greater than K. That is, a Hamming weight may be calculated for at least a part of an information bit sequence. Further, the value of m may be determined based on the size of information bits, a coding rate, list-X decoding and/or a modulation and coding scheme (MCS). The value of m may be predetermined or shared between a transmitter and a receiver. For example, the m-bit sequence may be CRC bits or information bits with low reliability.

In the following embodiments, it may be assumed that the length of a bit sequence, m for use in calculating a Hamming weight is 32. In this case, a maximum Hamming weight is 32 and thus 5 bits may be added to indicate the Hamming weight. Hereinbelow, a bit sequence for which a Hamming weight is calculated may be referred to as an m-bit sequence.

For example, Hamming weights may be divided into a plurality of ranges, each including Hamming weight values. For example, if Hamming weights are divided into N ranges, a Hamming weight may be represented in as many bits as a least integer equal to or greater than log 2N. For example, the Hamming weights may be divided into four ranges. For example, the Hamming weights may be divided into first, second, third, and fourth ranges. In this case, a rough value of a Hamming weight may be represented in 2 bits. For example, the values of Hamming weight-representing bits may correspond to the respective ranges. For example, if the Hamming weight of an m-bit sequence falls into the first range, the Hamming weight-representing bits may have a value of 0. If the Hamming weight of the m-bit sequence falls into the second range, the Hamming weight-representing bits may have a value of 1. If the Hamming weight of the m-bit sequence falls into the third range, the Hamming weight-representing bits may have a value of 2. If the Hamming weight of the m-bit sequence falls into the fourth range, the Hamming weight-representing bits may have a value of 3.

For example, the first range may include Hamming weights 0 to 4, the second range may include Hamming weights 5 to 8, the third range may include Hamming weights 9 to 16, and the fourth range may include Hamming weights 17 to 32. For example, if the Hamming weight of an m-bit sequence is 10, the Hamming weight-representing bits may have a value of 2. In this case, the receiver may be aware that a minimum value available as the Hamming weight is 9 and a maximum value available as the Hamming weight is 16, based on the value of the Hamming weight-representing bits.

For example, the first range may include Hamming weights 0 to 8, the second range may include Hamming weights 9 to 16, the third range may include Hamming weights 17 to 24, and the fourth range may include Hamming weights 25 to 32. For example, if the Hamming weight of an m-bit sequence is 10, the Hamming weight-representing bits may have a value of 1. In this case, the receiver may be aware that a minimum value available as the Hamming weight is 9 and a maximum value available as the Hamming weight is 16, based on the value of the Hamming weight-representing bits.

Since Hamming weight-representing bits indicating a range of Hamming weights is transmitted, instead of a Hamming weight, as described above, the overhead of Hamming weights may be reduced. For example, the Hamming weight-representing bits may be transmitted on a physical uplink shared channel (PUSCH) or a physical uplink control channel (PUCCH).

Additional information may be transmitted to the receiver, along with the afore-described Hamming weight-representing bits. For example, 1 bit may be added to indicate whether an actual Hamming weight is close to the minimum or maximum value of a range to which the Hamming weight belongs. For example, if the additional bit is 0, this may imply that the actual Hamming weight is close to the minimum value of the range. If the additional bit is 1, this may imply that the actual Hamming weight is close to the maximum value of the range.

For example, Hamming weights may be divided into four ranges 0 to 8, 9 to 16, 17 to 24, and 25 to 32. For example, if the Hamming weight of an m-bit sequence is 20, Hamming weight-representing bits are set to 2 (e.g., a binary value, 10). In this case, the Hamming weight 20 is closer to the minimum value of its range, 17. Thus, the additional bit may be set to 0. In this case, three Hamming weight-representing bits including the additional bit are configured and set to a binary number '100'. Therefore, the receiver may determine that the actual Hamming weight ranges from 17 to 20 based on the Hamming weight-representing bits.

Further, for example, the actual Hamming weight may be the middle value of the range. For example, the Hamming weight may range from 0 to 8. Also, the actual Hamming weight may be 4, the middle value of the range. In this case, the additional bit may be preset to 0 or 1. The preset values of the additional bit may be shared between the transmitter and the receiver.

To reduce signaling overhead, for example, one Hamming weight-representing bit may be transmitted. Then, the Hamming weight-representing bit may indicate whether a Hamming weight is odd-numbered or even-numbered. For example, if an error probability is 1%, the probability of generating an error in one bit of a 5-bit sequence is 95.1%. However, the probability of generating an error in two bits of the 5-bit sequence is 4.8%. Since the probability of generating errors in two bits simultaneously is relatively low, the Hamming weight-representing bit may be used in identifying an error by indicating whether a Hamming weight is an odd number or an even number.

The bit indicating whether a Hamming weight is an odd number or an even number may be used along with bits indicating a range to which the Hamming weight belongs.

Now, a detailed description will be given of the above embodiments.

In the following description, a Hamming weight is calculated for an m-bit sequence. The m-bit sequence is at least a part of an N-bit codeword. The m-bit sequence may be a bit sequence including the least significant bit (LSB) of the codeword and m consecutive bits of the codeword. For example, the m-bit sequence may be a bit sequence including the most significant bit (MSB) of the codeword and m consecutive bits of the codeword. For example, the m-bit sequence may be configured to include a CRC of the codeword. The value of m may be determined based on the size of information bits, a coding rate, list-X decoding, and/or an MCS. Further, the value of m may be predetermined or shared between the transmitter and the receiver. The codeword may be encoded based on a polar code.

While Hamming weight information may indicate the Hamming weight of an m-bit sequence, it may indicate the Hamming weight indirectly in the following embodiments. The Hamming weight information may be transmitted on a PUSCH or a PUCCH in the following embodiments.

Embodiment 1

A Hamming weight may range from 0 to m for an m-bit sequence. Herein, Hamming weights may be grouped into a plurality of ranges. For example, the Hamming weights may be grouped into k ranges.

A cut-off point that distinguishes one range from another range may be set according to an integer of m/k. For example, the ranges may be set to [0, 1, ..., m/k−1, m/k], [m/k+1, m/k+2, ..., 2m/k−1, 2m/k] ... [(k−a)m/k, (k−1)m/k+1, ..., m−1, m]. For example, if k is 4 and m is 32, the ranges may be [0, 1, 2, 3, 4, 5, 6, 7, 8], [9, 10, 11, 12, 13, 14, 15, 16], [17, 18, 19, 20, 21, 22, 23, 24], and [25, 26, 27, 28, 29, 30, 31, 32]. If m/k is not an integer, integer multiples of the ceiling, floor, or rounded value of m/k may be set as cut-off points among the ranges. Or the value of m may be set to an integer multiple of k.

Further, m may be set to $2^{k+1}$. A cut-off point of each range may be set to a power of 2. In this case, the ranges may be set to [0, 1, 2, 3, 4], [5, 6, 7, 8] ... [$2^k$+1, $2^k$+2, ..., m−1, m]. For example, if k is 4 and m is 32, the ranges may be [0, 1, 2, 3, 4], [5, 6, 7, 8], [9, 10, ..., 15, 16], [17, 18, ..., 31, 32].

Hamming weight information may include a range indicator with minimum bits to indicate a Hamming weight range. For example, the range indicator may be configured in as many bits as a least integer equal to or larger than $\log_2 k$. The values of the range indicator may indicate the respective ranges.

Embodiment 2

As described above in relation to Embodiment 1, Hamming weights may be grouped into a plurality of ranges. In this embodiment, each of the plurality of ranges may be divided into a plurality of sub-ranges. A sub-range indicator indicating a sub-range to which an actual Hamming weight belongs may be included together with a range indicator in Hamming weight information. For example, each range may be divided into two sub-ranges. In this case, the sub-range indicator may be configured in 1 bit. For example, if the actual Hamming weight is close to the minimum value of a range to which the actual Hamming weight belongs, the sub-range indicator may be 0. If the actual Hamming weight is close to the maximum value of the range to which the actual Hamming weight belongs, the sub-range indicator may be 1. Further, each range may be divided into $2^s$ sub-ranges and the sub-range indicator may be configured in s bits. Further, Hamming weight information may include a range indicator and a sub-range indicator.

Embodiment 3

In Embodiment 3, Hamming weight information may include 1 bit indicating whether a Hamming weight is an even number or an odd number.

Embodiment 4

In this embodiment, a configuration of Hamming weight information will be described. For example, Hamming weight information may include an actual Hamming weight. The Hamming weight information may include the range indicator of Embodiment 1, the sub-range indicator of Embodiment 2, and/or the 1-bit odd number/even number indicator of Embodiment 3. For example, the Hamming weight information may include the range indicator of Embodiment 1 and the sub-range indicator of Embodiment 2. For example, the Hamming weight information may include the range indicator of Embodiment 1 and the 1-bit odd number/even number indicator of Embodiment 3. For example, the Hamming weight information may include all of the range indicator of Embodiment 1, the sub-range indicator of Embodiment 2, and the 1-bit odd number/even number indicator of Embodiment 3.

The above-described Hamming weight information may be configured based on the length of an m-bit sequence and/or an MCS. For example, if the m-bit sequence has a length equal to or less than a first length (e.g., 4 bits), the Hamming weight information may include an actual Hamming weight or the 1-bit odd number/even number indicator of Embodiment 3. If the m-bit sequence has a length greater than the first length and equal to or less than a second length (e.g., 16 bits), the Hamming weight information may include the actual Hamming weight, the range indicator of Embodiment 1, or the 1-bit odd number/even number indicator of Embodiment 3. If the m-bit sequence has a length greater than the second length, the Hamming weight information may include the range indicator of Embodiment 1, or the 1-bit odd number/even number indicator of Embodiment 3. Further, if the m-bit sequence has a length greater than the second length, the Hamming weight information may include the range indicator of Embodiment 1, and the sub-range indicator of Embodiment 2. Further, if the m-bit sequence has a length greater than the second length, the Hamming weight information may include the range indicator of Embodiment 1, and the 1-bit odd number/even number indicator of Embodiment 3. A Hamming weight configuration may be preset, or the transmitter may indicate the Hamming weight configuration to the receiver.

For example, if an MCS with an order equal to or larger than a predetermined order is used, the Hamming weight information may include the range indicator of Embodiment 1, or the 1-bit odd number/even number indicator of Embodiment 3. For example, if an MCS with an order less than the predetermined order is used, the Hamming weight information may include the range indicator of Embodiment 1, and the sub-range indicator of Embodiment 2. Further, if an MCS with an order less than the predetermined order is used, the Hamming weight information may include the range indicator of Embodiment 1, and the 1-bit odd number/even number indicator of Embodiment 3. If a Hamming weight is determined based on an MCS, the receiver may determine the configuration of Hamming weight information based on MCS information received from the transmitter.

Figure 11:
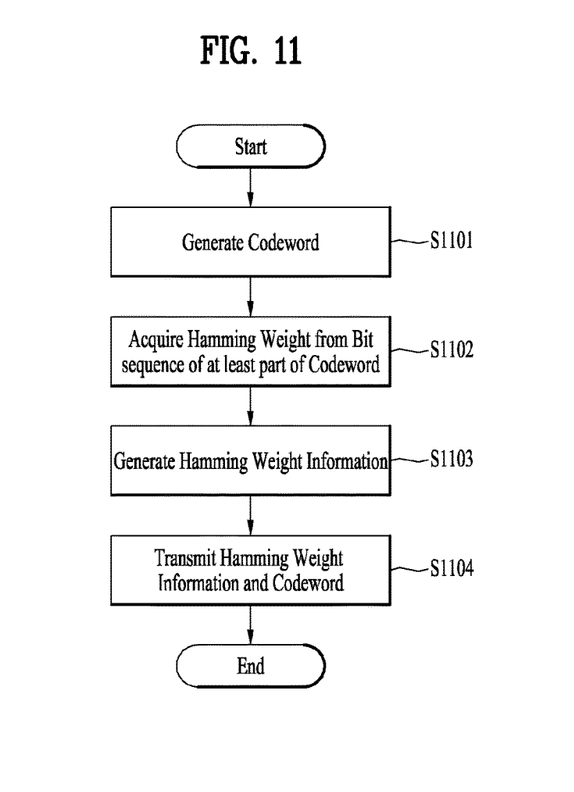
FIG. 11 is a flowchart illustrating a codeword transmission method according to an embodiment.

FIG. 11 is a flowchart illustrating a codeword transmission method according to an embodiment.

A transmitter generates a codeword by encoding an input signal to be transmitted (S1101). The codeword may be generated by encoding the input signal based on a polar code. The transmitter may acquire a Hamming weight from the bit sequence of at least a part of the codeword (S1102). The size and position of the bit sequence from which the Hamming weight is acquired may be determined in the afore-described method. The transmitter may generate Hamming weight information indicating the Hamming weight from the acquired Hamming weight (S1103). A configuration of the Hamming weight information may be determined according to Embodiment 1 to Embodiment 4. The transmitter may transmit the Hamming weight information and the codeword to a receiver (S1104). As described above, for example, the transmitter may transmit the Hamming weight information on a PUSCH or a PUCCH.

The receiver may decode the codeword in a reverse order. The receiver may receive the codeword and the Hamming weight information, and decode the codeword based on the Hamming weight information. For example, the receiver may decode the codeword by list decoding.

Figure 12:
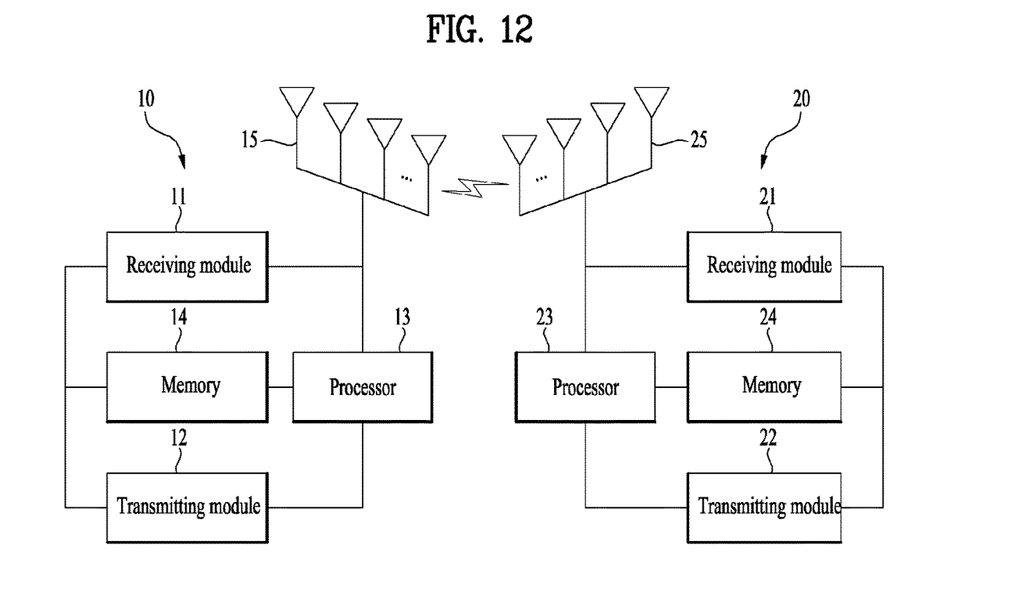
FIG. 12 is a block diagram illustrating configurations of a base station (BS) and a user equipment (UE) according to an embodiment of the present disclosure.

FIG. 12 is a schematic diagram for explanation of components of apparatuses to which the embodiments of the present invention of FIGS. 1 to 11 are applicable, according to an embodiment of the present invention.

Referring to FIG. 12, a BS apparatus 10 according to the present invention may include a receiving module 11, a transmitting module 12, a processor 13, a memory 14, and a plurality of antennas 15. The transmitting module 12 may transmit various signals, data, and information to an external apparatus (e.g., a UE). The receiving module 11 may receive various signals, data, and information from an external apparatus (e.g., a UE). The receiving module 11 and the transmitting module 12 may each be referred to as a transceiver. The processor 13 may control an overall operation of the BS apparatus 10. The antennas 15 may be configured according to, for example, 2-dimensional (2D) antenna arrangement.

The processor 13 of the BS apparatus 10 according to an embodiment of the present invention may be configured to receive channel state information according to proposed embodiments of the present invention. In addition, the processor 13 of the BS apparatus 10 may perform a function for calculating and processing information received by the BS apparatus 10 and information to be externally transmitted, and the memory 14 may store the calculated and processed information for a predetermined time period and may be replaced with a component such as a buffer (not shown) or the like.

Referring to FIG. 12, a UE apparatus 20 according to the present invention may include a receiving module 21, a transmitting module 22, a processor 23, a memory 24, and a plurality of antennas 25. The antennas 25 refer to a terminal apparatus for supporting MIMO transmission and reception. The transmitting module 22 may transmit various signals, data, and information to an external apparatus (e.g., an eNB). The receiving module 21 may receive various signals, data, and information from an external apparatus (e.g., an eNB). The receiving module 21 and the transmitting module 22 may each be referred to as a transceiver. The processor 23 may control an overall operation of the UE apparatus 20.

The processor 23 of the UE apparatus 20 according to an embodiment of the present invention may be configured to transmit channel state information according to proposed embodiments of the present invention. In addition, the processor 23 of the UE apparatus 20 may perform a function for calculating and processing information received by the UE apparatus 20 and information to be externally transmitted, and the memory 24 may store the calculated and processed information for a predetermined time period and may be replaced with a component such as a buffer (not shown) or the like.

The aforementioned components of the BS apparatus 10 and the UE apparatus 20 may be embodied by independently applying the above description of the present invention or simultaneously applying two or more embodiments of the present invention, and a repeated description is not given for clarity.

In addition, with regard to the various embodiments of the present invention, although an example in which a downlink transmission entity or an uplink reception entity is an eNB and a downlink reception entity or an uplink transmission entity is a UE has been described, the scope of the present invention is not limited thereto. For example, the above description of the eNB may be applied in the same way to the case in which a cell, an antenna port, an antenna port group, an RRH, a transmission point, a reception point, an access point, a relay, etc. are a downlink transmission entity to a UE or an uplink reception entity from the UE. In addition, the principle of the present invention that has been described with regard to the various embodiments of the present invention may also be applied in the same way to the case in which a relay is a downlink transmission entity to a UE or an uplink reception entity to a UE or the case in which a relay is an uplink transmission entity to an eNB or a downlink reception entity from an eNB.

As is apparent from the foregoing description, the embodiments of the present disclosure have the following effects.

According to the embodiments of the present disclosure, decoding performance can be improved by decoding based on a Hamming weight.

According to the embodiments of the present disclosure, signaling overhead can be reduced.

The embodiments of the present disclosure are applicable to various wireless access systems and broadcasting communication systems. Examples of the various wireless access systems include a 3rd generation partnership project (3GPP) system, a 3GPP2 system, and/or an institute of electrical and electronics engineers (IEEE) 802.xx system. The embodiments of the present disclosure may be applied to all technical fields in which the various wireless access systems find their applications, as well as the various wireless access systems.

The embodiments of the present disclosure may be achieved by various means, for example, hardware, firmware, software, or a combination thereof.

In a hardware configuration, an embodiment of the present disclosure may be achieved by one or more application specific integrated circuits (ASICs), digital signal processors (DSPs), digital signal processing devices (DSDPs), programmable logic devices (PLDs), field programmable gate arrays (FPGAs), processors, controllers, microcontrollers, microprocessors, etc.

In a firmware or software configuration, an embodiment of the present disclosure may be implemented in the form of a module, a procedure, a function, etc. Software code may be stored in a memory unit and executed by a processor. The memory unit is located at the interior or exterior of the processor and may transmit and receive data to and from the processor via various known means.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by a subsequent amendment after the application is filed.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A method for transmitting a codeword by a transmitting end in a wireless communication system, the method comprising:
    generating a codeword by encoding an input signal based on a polar code;
    acquiring a Hamming weight from a bit sequence of at least a part of the codeword;
    generating Hamming weight information based on the Hamming weight; and
    transmitting the Hamming weight information and the codeword to a receiving end,
    wherein the Hamming weight information includes a range indicator indicating a range to which the Hamming weight belongs, among a plurality of ranges.

2. The method according to claim 1, wherein each of the plurality of ranges is divided into at least two sub-ranges, and
    wherein the Hamming weight information further includes a sub-range indicator indicating a sub-range to which the Hamming weight belongs in the range to which the Hamming weight belongs.

3. The method according to claim 1, wherein the Hamming weight information further includes a 1-bit indicator indicating whether the Hamming weight is an odd number or an even number.

4. The method according to claim 1, wherein the bit sequence of the at least part of the codeword includes a cyclic redundancy check (CRC) of the codeword.

5. The method according to claim 1, wherein the bit sequence of the at least part of the codeword includes a most significant bit (MSB) of the codeword.

6. The method according to claim 1, wherein the Hamming weight information is used to decode the codeword by list decoding.

7. A terminal for transmitting a codeword in a wireless communication system, the terminal comprising:
    a transceiver for transmitting and receiving a signal; and
    a processor for controlling the transceiver,
    wherein the processor is configured to generate a codeword by encoding an input signal based on a polar code, to acquire a Hamming weight from a bit sequence of at least a part of the codeword, to generate Hamming weight information based on the Hamming weight, and to transmit the Hamming weight information and the codeword to a receiving end, and
    wherein the Hamming weight information includes a range indicator indicating a range to which the Hamming weight belongs, among a plurality of ranges.

8. The terminal according to claim 7, wherein each of the plurality of ranges is divided into at least two sub-ranges, and
    wherein the Hamming weight information further includes a sub-range indicator indicating a sub-range to which the Hamming weight belongs in the range to which the Hamming weight belongs.

9. The terminal according to claim 7, wherein the Hamming weight information further includes a 1-bit indicator indicating whether the Hamming weight is an odd number or an even number.

10. The terminal according to claim 7, wherein the bit sequence of the at least part of the codeword includes a cyclic redundancy check (CRC) of the codeword.

11. The terminal according to claim 7, wherein the bit sequence of the at least part of the codeword includes a most significant bit (MSB) of the codeword.

12. The terminal according to claim 7, wherein the Hamming weight information is used to decode the codeword by list decoding.

* * * * *